United States Patent
Chang et al.

(10) Patent No.: US 6,982,135 B2
(45) Date of Patent: Jan. 3, 2006

(54) PATTERN COMPENSATION FOR STITCHING

(75) Inventors: Chung-Hsing Chang, Chin-Mei (TW);
Chien-Hung Lin, Hsin-Chu (TW);
Burn J. Lin, Hsin-Chu (TW);
Chia-Hui Lin, Hsin-Chu (TW);
Chih-Cheng Chin, Junghe (TW);
Chin-Hsiang Lin, Kaohsiung (TW);
Fu-Jye Liang, Kaohsiung (TW);
Jeng-Horng Chen, Hsin-Chu (TW);
Bang-Ching Ho, Hsin-Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 189 days.

(21) Appl. No.: 10/402,590

(22) Filed: Mar. 28, 2003

(65) Prior Publication Data

US 2004/0191643 A1    Sep. 30, 2004

(51) Int. Cl.
G03F 9/00   (2006.01)
G03F 7/20   (2006.01)
(52) U.S. Cl. ............................ 430/5; 430/311; 430/396
(58) Field of Classification Search .................... 430/5, 430/296, 942, 311, 394, 396; 716/19–21
See application file for complete search history.

(56) References Cited

U.S. PATENT DOCUMENTS

| | | | |
|---|---|---|---|
| 5,055,383 A | 10/1991 | Koblinger et al. | ........... 430/312 |
| 5,532,090 A | 7/1996 | Borodovsky | ................... 430/5 |
| 5,571,641 A | 11/1996 | Bae | ............................... 430/5 |
| 5,792,591 A * | 8/1998 | Theuwissen | ................. 430/312 |
| 5,922,495 A | 7/1999 | Kim | .............................. 430/5 |
| 6,048,785 A | 4/2000 | Fulford, Jr. et al. | ........ 438/621 |
| 6,162,581 A * | 12/2000 | Nakasuji et al. | ............ 430/296 |
| 6,258,511 B1 * | 7/2001 | Okino | ......................... 430/296 |
| 6,333,138 B1 * | 12/2001 | Higashikawa et al. | ...... 430/296 |
| 6,506,544 B1 * | 1/2003 | Hori et al. | ................... 430/394 |

OTHER PUBLICATIONS

Horiuchi, "Gradation Stitching Exposure for Step-and-Scan Projection Printing System", *Jpn. J. Appl. Phys.*, vol. 37, pp. 6641-6647, Part 1., No. 12A, Dec. 1998.

Morita et al., "Basic Characteristics of Beam Position Drift and Field Stitching Error Caused by Electron Beam Column Charging", *Jpn. J. Appl. Phys.*, vol. 35, pp. 4121-4127, Part 1, No. 7, Jul. 1996.

(Continued)

*Primary Examiner*—Kathleen Duda
(74) *Attorney, Agent, or Firm*—Duane Morris LLP; Steven E. Koffs

(57) ABSTRACT

A method for transferring a pattern from a mask to a substrate (or wafer), comprises dividing a mask generation data file into a plurality of segments. The segments include a main pattern area and a stitching area. Each stitching area contains a respective common pattern. An image of an illuminated portion of the main pattern area is formed. Connection ends of the segments in a substrate area (or wafer area) are illuminated with an illumination beam. An image of the illuminated portion of the main pattern area is formed, and a halftone gray level dosage distribution is produced in the substrate area (or wafer area) corresponding to the common pattern. The common patterns of adjacent segments substantially overlap in the substrate area (or wafer area).

18 Claims, 6 Drawing Sheets

OTHER PUBLICATIONS

Yamashita et al., "Recent Progress In Electron Beam Cell Projection Technology", *Jpn. J. Appl. Phys.*, vol. 35, pp. 6404-6414, Part 1, No. 12B, 1996.

"Halftones, Photos and Grayscale Printing", Chap. 10, pp. 293-297.

Stitching, "Breaking the stepper field size limitation", Tower Semiconductor, Ltd, 2 pages.

Hara, "Stitching accuracy key to Nikon's EPL prototype", EE Times, Feb. 14, 2003, 4 pages.

* cited by examiner

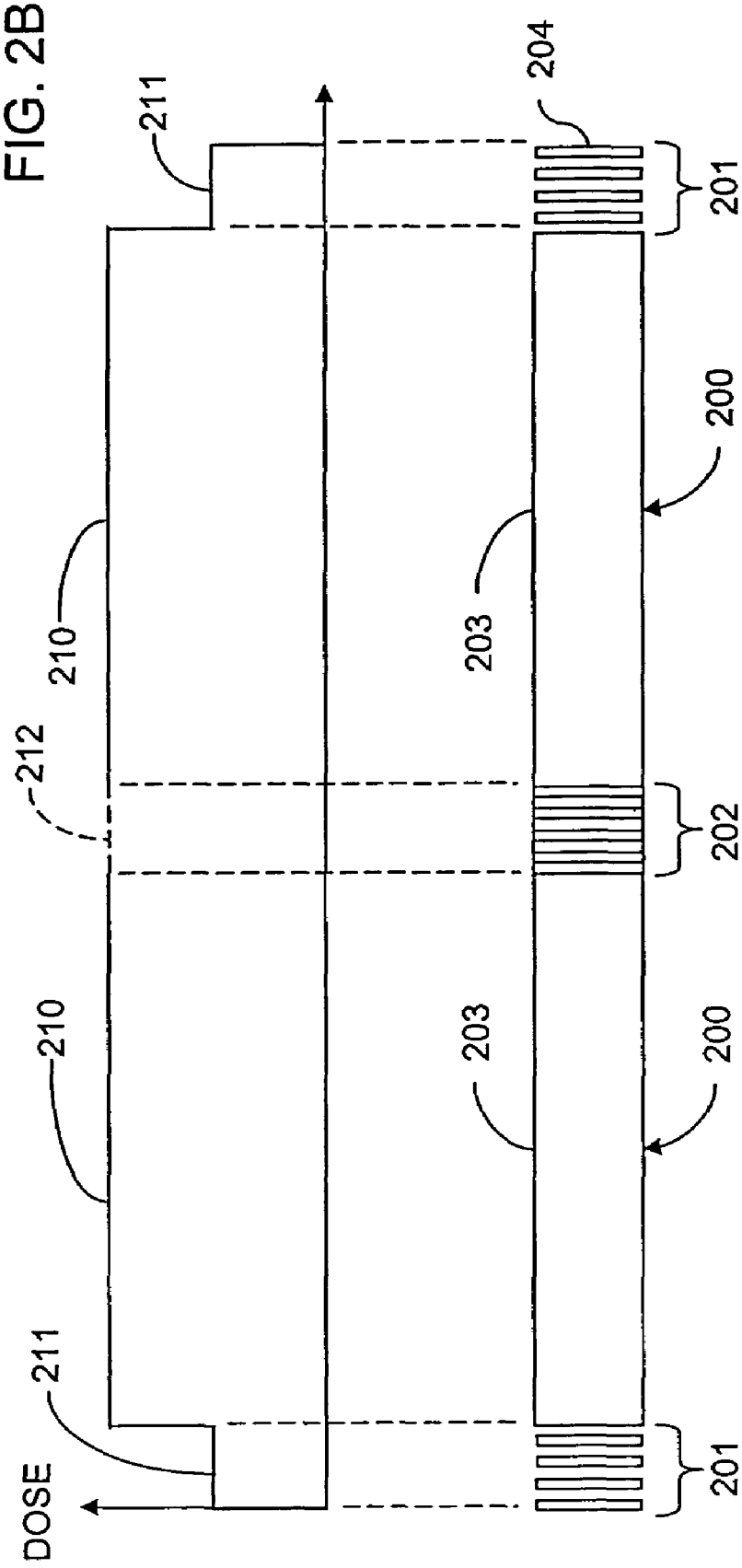

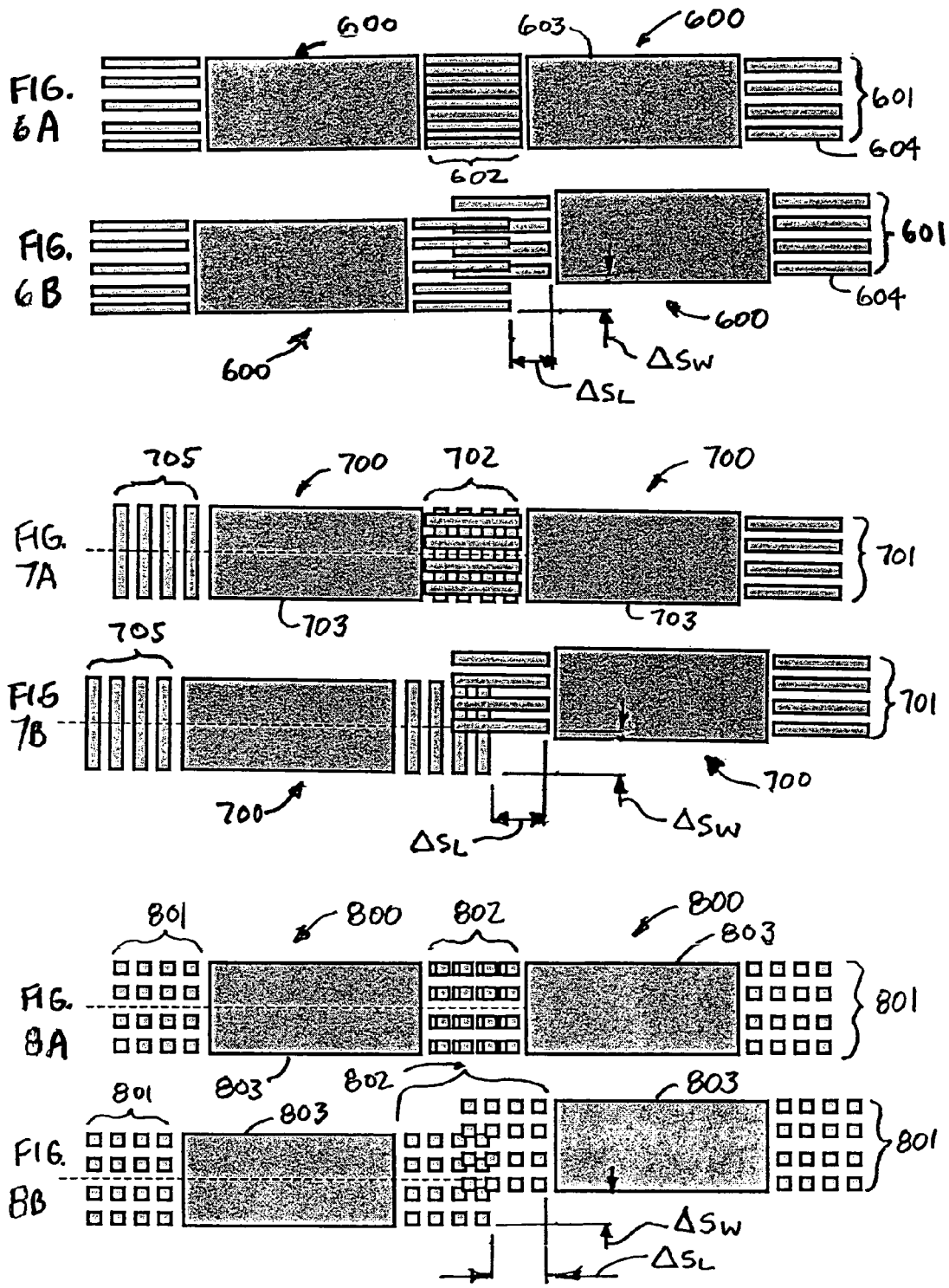

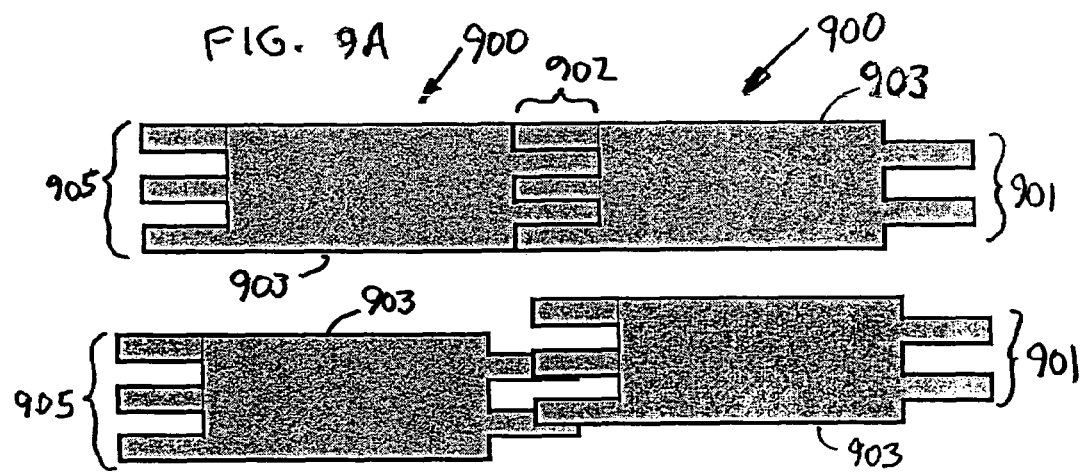
FIG. 9A
FIG. 9B
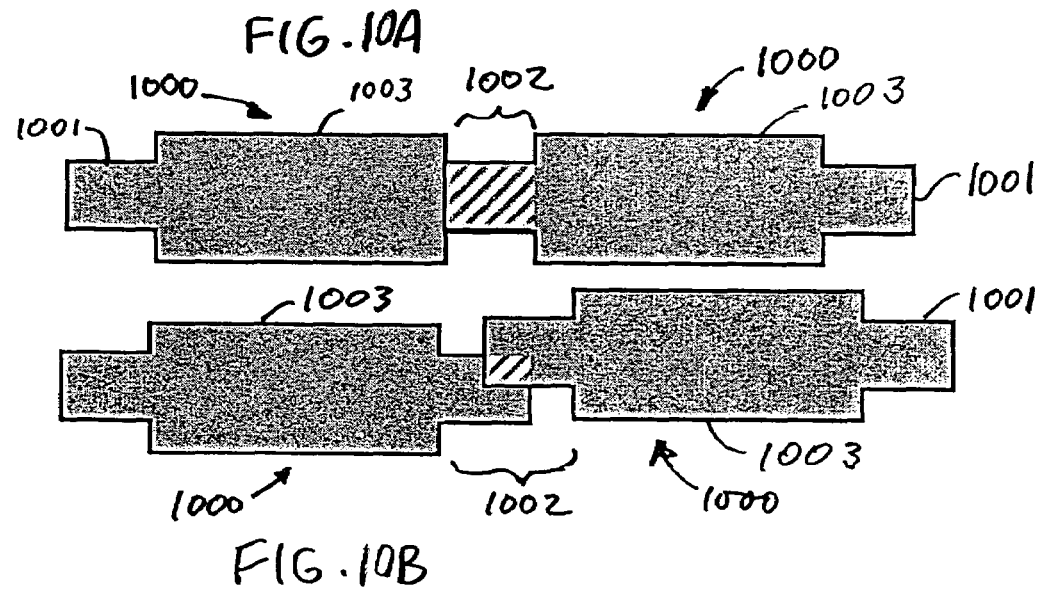
FIG. 10A
FIG. 10B

PATTERN COMPENSATION FOR STITCHING

FIELD OF THE INVENTION

The present invention relates generally to semiconductor fabrication techniques, and more specifically to stitching techniques.

BACKGROUND

The semiconductor fabrication industry continuously strives to reduce geometries to allow greater numbers of devices to be formed within an integrated circuit (IC). There are competing requirements to form larger masks with finer line widths. It is difficult to increase resolution and increase the field size at the same time.

An illumination beam exposure system includes an illumination optical system to illuminate a mask with an illumination beam, and a projection optical system to project the illumination beam through a mask onto a sensitive substrate. For the critical dimension (CD) to be small, a high degree of controllability is required for the electron beam and pattern placement. In direct write electron beam exposure systems, for any given number of address points in the mask definition, as the spacing decreases with the line width, the size of a writable field decreases commensurately. Further, if the wavelength is shortened to improve resolution, the depth of focus becomes shallower.

To address this issue, it is now common to write a plurality of smaller sub-fields, each within the limits of the electron beam system. A single elongated line may be spread across a plurality of sub-fields. The lines in the individual sub-fields are stitched together, using a step-and-scan exposure system. A small sub-field of the reticle is illuminated, and the scanning stage on which the reticle is positioned is stepped to the location of the next sub-field. The connection ends of the line segments in each sub-field overlap, enabling formation of a fine line having a length that exceeds the size of the largest subfield the beam system is capable of forming. If there are positional errors in registering the corresponding subfields, the result is discontinuities in the line. Two adjacent segments of a line may be offset sufficiently to substantially affect the resistance in the stitching region.

Stitching errors can cause leakage or generate retention time problems, if the narrowest line width in the stitching area is less than 90% of the gate length. Stitching errors can also produce a weaker device in terms of drive current, if the widest line width in the stitching area is too large.

A variety of techniques have been devised to improve the continuity of the stitched lines. For example, U.S. Pat. Nos. 5,055,383 and 5,922,495 describe structures for stitching.

Hiroshi Yamashita et al., "Recent Progress in Electron-Beam Cell Projection Technology" Jpn J. Appl. Phys., Vol. 35 (1996) pp. 6404–6414 describes patterns that can be used in the overlap regions, including partially overlapping convex "V" shaped line segment ends. Another embodiment is described having a pair of complementary convex and concave "V" shaped ends.

FIG. 1A shows an example of stitching using Yamashita's additional patterns. A pair of adjacent line segments 100, each have a main pattern area 103 and convex "V" shaped connecting ends 101, which overlap in the stitching area 102. FIG. 1B shows the dosage profile for the stitched line of FIG. 1A. The main portion 103 of each line 100 has a constant dosage 110. At the convex ends 101, the dosage level 111 continuously drops off from the full dosage 110 to zero. In the stitching region 102, the total dosage 112 from the two overlapping patterns is approximately the value of the full dosage 110 in the main segments 103 of the lines.

Horiuchi, Toshiyuki, "Gradation Stitching Exposure for Step-and-Scan Projection Printing System," Jpn J. Appl. Phys. Vol. 37 (1998) pp. 6641–6647 describes a technique for using the electron beam to provide a variable exposure dose to the connection ends of each line segment in the stitching area. Horiuchi's step-and-scan apparatus includes a blind slit having a convex pattern (e.g., "V" shaped) on the end of the segments, so that the pattern formed has a convex pattern in the stitching area. The overlapping length is set large relative to the line width, and the taper of the "V" shape is gentle, so that the even in the presence of stitching error (offset) in the width direction, the gradation slope of the dose is not excessive.

In Horiuchi's method, the doses change continuously at the boundary of the stitched fields, falling off to substantially zero dosage at the very end of each segment. The convex patterns are generally configured so that, if there are no stitching errors (positional misalignment in the length or width directions), the dosage in the overlapping stitching region is approximately constant.

SUMMARY OF THE INVENTION

A method of fabricating a mask comprises: dividing a mask generation date file into a plurality of segments, said segments including a main pattern area and a stitching area, said each stitching area containing a respective geometric pattern; and forming a set of geometric features in the stitching area, said geometric features producing a halftone gray level dosage distribution after illumination.

A method for transferring a pattern from a mask to a substrate (or wafer), comprises dividing a mask generation data file into a plurality of segments. The segments include a main pattern area and a stitching area. Each stitching area contains a respective common pattern. An image of an illuminated portion of the main pattern area is formed. Connection ends of the segments in a substrate area (or wafer area) are illuminated with an illumination beam. An image of the illuminated portion of the main pattern area is formed, and a halftone gray level dosage distribution is produced in the substrate area (or wafer area) corresponding to the common pattern. The common patterns of adjacent segments substantially overlap in the substrate area (or wafer area).

BRIEF DESCRIPTION OF THE DRAWINGS

FIG. 2A is a diagram of a pair of adjacent line segments stitched together according to a first exemplary embodiment of the invention. FIG. 2B shows the dosage distribution for the line segments of FIG. 2A.

FIG. 6A is a diagram of a pair of adjacent line segments stitched together according to a second exemplary embodiment of the invention. FIG. 6B is a diagram of the adjacent line segments of FIG. 6A with stitching errors.

FIG. 7A is a diagram of a pair of adjacent line segments stitched together according to a second exemplary embodiment of the invention. FIG. 7B is a diagram of the adjacent line segments of FIG. 7A with stitching errors.

FIG. 8A is a diagram of a pair of adjacent line segments stitched together according to a second exemplary embodiment of the invention. FIG. 8B is a diagram of the adjacent line segments of FIG. 8A with stitching errors.

FIG. 9A is a diagram of a pair of adjacent line segments stitched together according to a second exemplary embodiment of the invention. FIG. 9B is a diagram of the adjacent line segments of FIG. 9A with stitching errors.

FIG. 10A is a diagram of a pair of adjacent line segments stitched together according to a second exemplary embodiment of the invention. FIG. 10B is a diagram of the adjacent line segments of FIG. 10A with stitching errors.

DETAILED DESCRIPTION

Figures 1A, 1B:
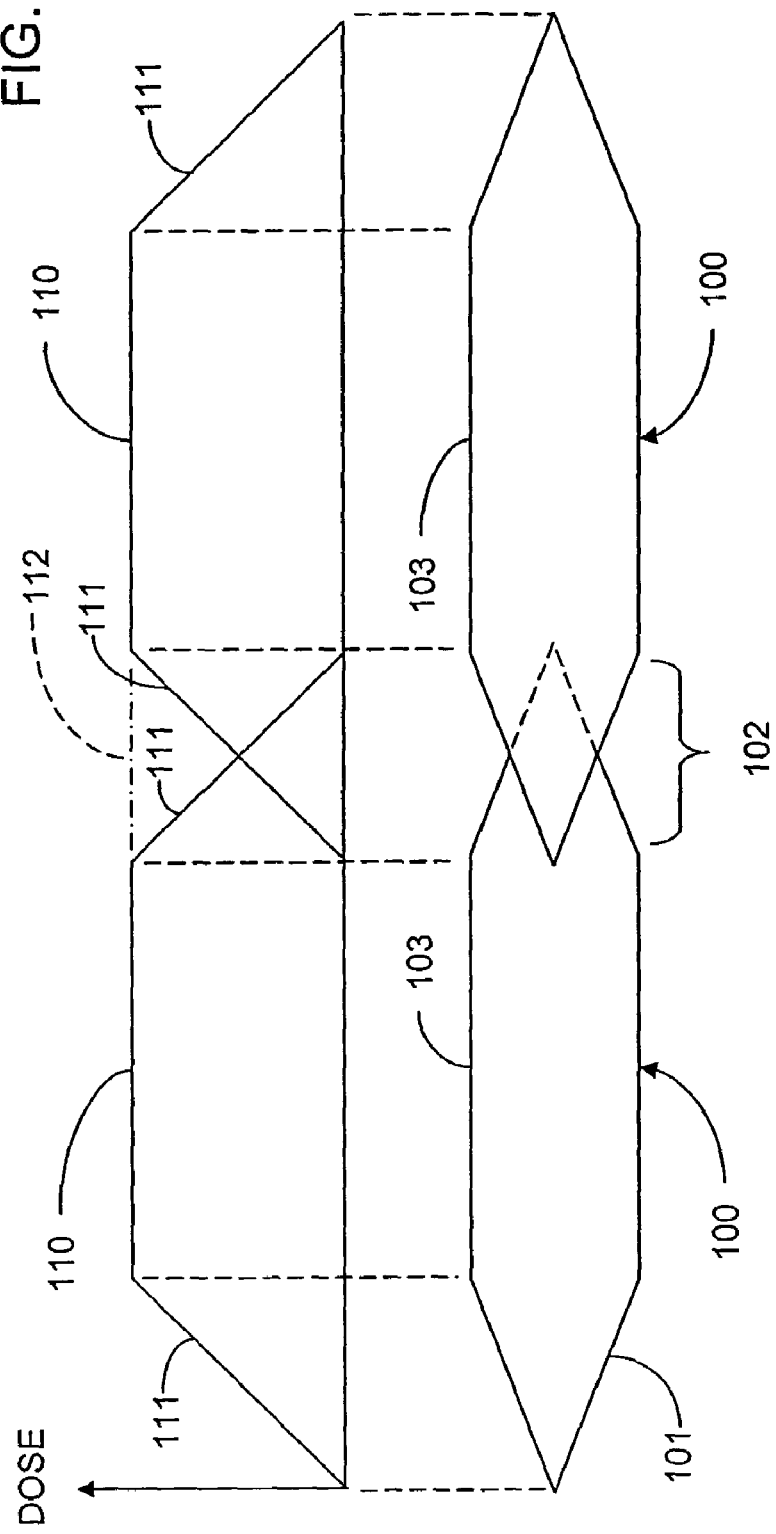
FIG. 1A is a diagram of a conventional pair of adjacent line segments stitched together.
FIG. 1B shows the dosage distribution for the line segments of FIG. 1A.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 2 shows an exemplary structure and method for transferring a pattern from a mask to a substrate (or wafer).

A mask generation data file is divided into a plurality of segments 200, such that each segment can fit within the maximum field size for the projection optics of the stepper system. The segments 200 include a main pattern area 203 and a stitching area 202. The stitching area 202 is adjacent to the main pattern area 203, and the stitching area is the connection end 201 of the segments 200. Each stitching area 202 contains a respective common pattern 201. The common pattern in the stitching area 202 has a halftone gray level dosage distribution. In the example of FIG. 2A, the common pattern in the stitching area 201 comprises a coupling pattern including geometric features, such as polygons. In alternative embodiments, the geometric features can be circles, ovals or ellipses, but polygons are believed to be preferred, because they are easier to define.

The exemplary polygons 204 are elongated rectangles. The polygons can form halftone gray level dosage without causing diffraction. The exemplary polygons 204 are optionally sub-resolution features. In other embodiments, larger polygons can be used, which are not sub-resolution features.

An image of an illuminated portion of the main pattern area is formed.

The connection ends 201 of the segments 200 in a substrate area 202 (or wafer area) are illuminated with an illumination beam.

An image of the illuminated portion of the main pattern area 203 is formed and a halftone gray level dosage distribution is produced in the substrate area (or wafer area) 202 corresponding to the common pattern 201. To achieve the best depth of focus in a conventional gradation stitching pattern, the angle of the V-shape needs to be optimized and then the angle fixed. For a halftone dosage distribution as described herein, some combinations of the features can achieve the same performance as the optimized gradation pattern, but using the halftone pattern, it is not necessary to constrain the feature shapes. Meanwhile, polygon and square feature do not impact the cycle time (or throughput) significantly during mask making. The common patterns 201 of adjacent segments substantially overlap in the substrate area 202. Although the total patterns substantially overlap, in some configurations, when there is zero stitching error, the individual shapes that form the patterns are interlaced alongside each other, as shown in region 202 of FIG. 2A. The individual shapes within the overlapping patterns may lie next to each other (FIG. 2A) or partly overlie each other (e.g., FIGS. 8A and 8B). FIG. 2B shows the dosage distribution resulting from the exemplary pattern in FIG. 2A. In FIG. 2B, when the two line segments 200 are correctly aligned, the total dosage 212 in the stitching area 202 is approximately the same as the full dosage 210 in the main pattern areas 203.

Figure 3A:
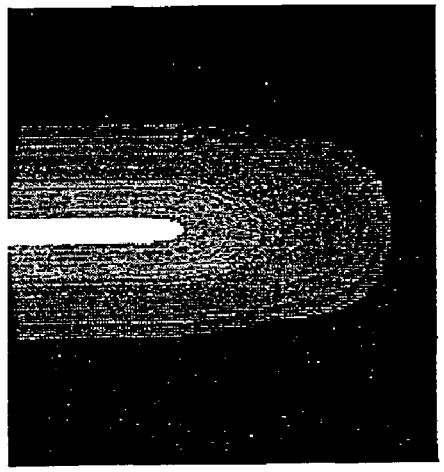
FIGS. 3A shows a connection end of one of the segments of FIG. 2A.
Figure 3B:
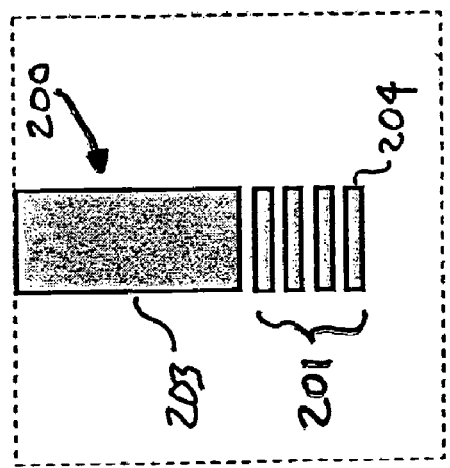
FIG. 3B shows a simulation of a dosage distribution formed by the pattern of FIG. 3A.

FIGS. 3A and 3B show one of the connection ends 201 (FIG. 3A), and the corresponding simulation results of the mask dosage data (FIG. 3B). Because the features 204 have a width smaller than the resolution of the beam on the mask, the resulting pattern in the mask provides a good approximation of a gray scale, by using a halftone gray level dosage distribution. FIGS. 5A and 5B are the aerial and contour simulation results produced by the pattern in FIG. 4, but without misalignment in the width direction.

Figure 4:
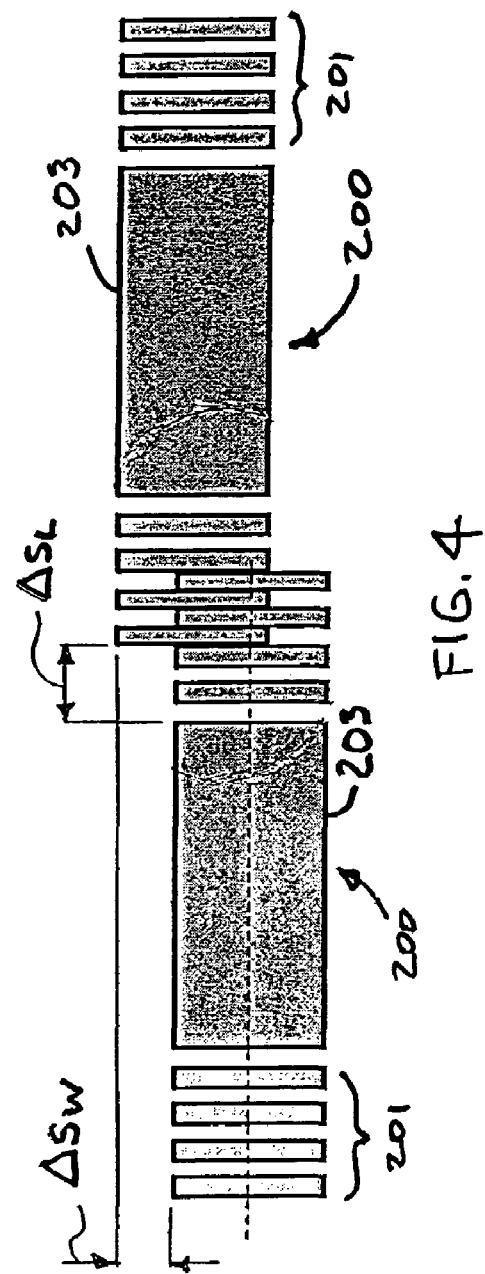
FIG. 4 is a diagram of the adjacent line segments of FIG. 2A with stitching errors.
Figure 5B:
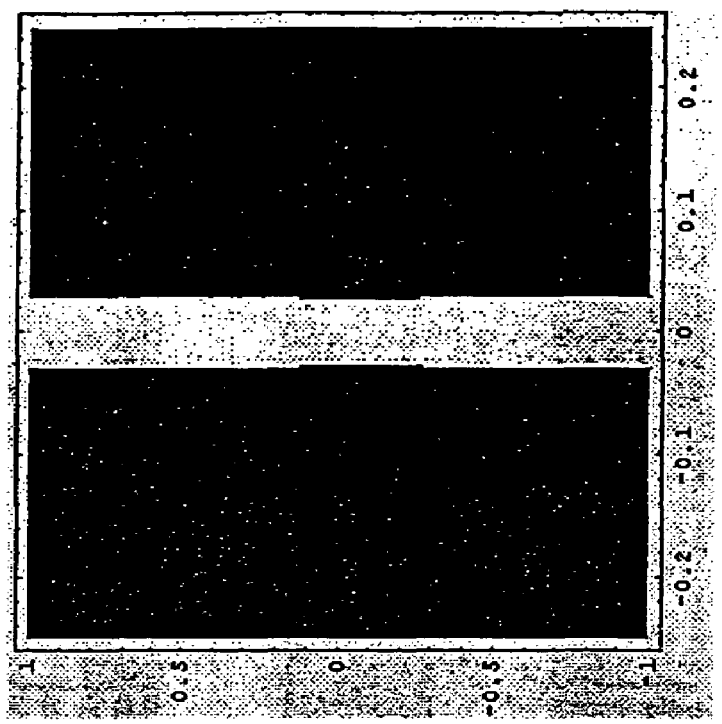
FIG. 5B is a contour image.
Figure 5A:
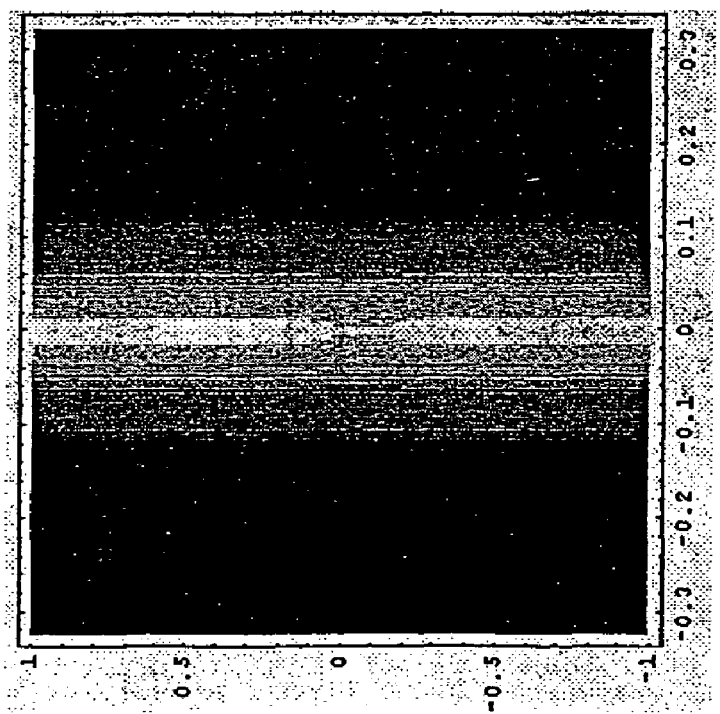
FIG. 5A is a simulation of an aerial image formed on a reticle by the beam pattern of FIG. 4, but without misalignment in the width direction.

FIG. 4 shows a result of misalignment between the first and second pass of the stepper. In FIG. 4, there is a misalignment in both directions, including a misalignment $\Delta s_L$ in the longitudinal direction and a misalignment $\Delta s_W$ in the width direction. FIG. 4 shows a case in which the misalignment $\Delta s_L$ in the longitudinal direction is an even multiple of the width of the polygons 204. It is understood that both $\Delta s_L$ and $\Delta s_W$ can have any value. As is apparent from FIG. 4, a stitching error $\Delta s_W$ in the width direction does not cause any "hot spots" in which the dosage distribution is higher because of overlapping dosage concentrations in the first and second pass.

FIG. 5A shows a simulation of dosage distribution produced by the halftone stitching area shown in FIG. 4, with $\Delta s_W=0$. The necking phenomenon for the halftone dosage distribution in FIG. 5A is less than that of the V-shape pattern produced by the gradation stitching of the prior art. Also, the features in the stitching area of FIG. 5A are not restricted by angle or length. Further, it is much easier to make a mask without any angle lines in the patterns. the narrow white line in the center of the stitching area of FIG. 5A mean that total dosage is substantially lower than in the main pattern areas, because $\Delta s_L$ is not equal to zero in this case.

FIG. 5B shows a contour simulation of a line formed using the halftone stitching area shown in FIG. 4, with $\Delta s_W=0$.

FIGS. 6A and 6B show another embodiment of adjacent line segments 600 having main bodies 603 and stitching areas 601, including polygons 604. The polygons 604 are oriented in the longitudinal direction. FIG. 6A shows the patterns with zero stitching error, and FIG. 6B shows the patterns in the presence of both longitudinal and width direction stitching errors $\Delta s_L$ and $\Delta s_W$. In the case of the patterns of FIGS. 6A and 6B, a longitudinal stitching error $\Delta s_L$ does not cause any high dosage "hot spots".

FIGS. 7A and 7B show another embodiment of adjacent line segments 700 having main bodies 703, stitching areas 701 on the right side, and stitching area 705 on the left side.

Stitching area 701 has longitudinal polygons, and stitching area 705 has transverse polygons (in the width direction). FIG. 7A shows the patterns with zero stitching error, and FIG. 7B shows the patterns in the presence of both longitudinal and width direction stitching errors $\Delta s_L$ and $\Delta s_W$. In the case of the patterns of FIGS. 7A and 7B, for small stitching errors, the dosage is highest in a plurality of small areas where the longitudinal and transverse polygons cross over each other. Pattern shapes in FIGS. 6A, 6B 7A and 7B have similar performance. In either case, the total dosage at the stitching area should be identical to the non-stitching area.

FIGS. 8A and 8B show another embodiment of adjacent line segments 800 having main bodies 803 and stitching areas 801, including polygons 801. The exemplary polygons 801 are small squares or rectangles, but other polygons may be used. FIG. 8A shows the patterns with zero stitching error, and FIG. 8B shows the patterns in the presence of both longitudinal and width direction stitching errors $\Delta s_L$ and $\Delta s_W$. The dosage distribution for FIGS. 8A and 8B is relatively complex than FIG. 2A. That means the dosage could be controlled more precise at the stitching area using the patterns of FIG. 8A, thus reducing the error. When the line width shrinks, it becomes necessary to control the dosage more precisely.

FIGS. 9A and 9B show another embodiment of adjacent line segments 900 having main bodies 903 and stitching areas 901, including polygons 901 on the right and 905 on the left. The exemplary polygons 901 are longitudinal rectangles. This structure is similar to that of FIGS. 6A and 6B, except that the polygons 901 and 905 are connected to the main pattern area 903. Also, the polygons 901, 905 are wider than polygons 601. FIG. 9A shows the patterns with zero stitching error, and FIG. 9B shows the patterns in the presence of both longitudinal and width direction stitching errors $\Delta s_L$ and $\Delta s_W$.

FIGS. 10A and 10B show another embodiment of adjacent line segments 1000 having main bodies 1003 and stitching areas 1001, including polygons 1001. The exemplary polygons 1001 are small squares or rectangles, but other polygons may be used. FIG. 10A shows the patterns with zero stitching error, and FIG. 10B shows the patterns in the presence of both longitudinal and width direction stitching errors $\Delta s_L$ and $\Delta s_W$. Both the patterns of FIGS. 9A, 9B, 10A and 10B use rectangular shapes for a halftone gray level dosage distribution. These patterns are easily formed, and provide acceptable performance. These patterns show that good results can be achieved by managing the total dosage distribution, with patterns of different size.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for transferring a pattern from a mask to a substrate, comprising:
   (a) dividing a mask generation data file into a plurality of segments, said segments including a main pattern area and a stitching area, each stitching area containing a respective common pattern that extends across an entire width of a pair of line segments that extend on both sides of the stitching area, the common pattern including a plurality of rectangles or squares;
   (b) forming an image of an illuminated portion of said main pattern area;
   (c) illuminating connection ends of said segments in a substrate area with an illumination beam; and
   (d) forming an image of the illuminated portion of said main pattern area and producing a halftone gray level dosage distribution in said substrate area corresponding to the common pattern, wherein said common patterns of adjacent segments substantially overlap in the substrate area.

2. The method of claim 1, wherein the stitching area is adjacent to the main pattern area, and the stitching area is the connection end of the segments.

3. The method of claim 1, wherein the common pattern in the stitching area comprises a coupling pattern.

4. The method of claim 1, wherein the common pattern in the stitching area has the halftone gray level dosage distribution.

5. The method of claim 1, wherein the rectangles or squares are sub-resolution features.

6. The method of claim 1, wherein the common pattern includes a plurality of spaces between the rectangles that extend across the entire width of the line segments.

7. A method for transferring a circuit pattern from a mask to a wafer, comprising:
   (a) dividing a mask generation data file into a plurality of segments, said segments including a main pattern area and a stitching area, each stitching area containing a respective common pattern that extends across an entire width of a pair of line segments that extend on both sides of the stitching area, the common pattern including a plurality of rectangles or squares;
   (b) illuminating said segments with a charged-particle beam;
   (c) forming an image of the illuminated portion of said main pattern area;
   (d) illuminating a connection end of said segments in a wafer area with a charged-particle beam; and
   (e) forming an image of the illuminated portion of said stitching area and producing a halftone gray level dosage distribution in said wafer area corresponding to the common pattern, wherein said common patterns of adjacent segments substantially overlap in the wafer area.

8. The method of claim 7, wherein the stitching area is adjacent to the main pattern area, and the stitching area is at a connection end of the segments.

9. The method of claim 7, wherein the common pattern in the stitching area comprises a coupling pattern.

10. The method of claim 7, wherein the common pattern in the stitching area has the halftone gray level dosage distribution.

11. A method for transferring a circuit pattern from a mask to a wafer, comprising:
   (a) dividing a mask generation data file into a plurality of segments, said segments including a main pattern area and a stitching area, each stitching area containing a respective stitching pattern that extends across an entire width of a pair of line segments that extend on both sides of the stitching area, the stitching pattern including a plurality of rectangles, such that the rectangles in the stitching pattern in a first one of the segments are oriented vertically, and the rectangles in the stitching pattern in a second one of the segments are oriented horizontally;
   (b) illuminating said segments with a illumination beam;
   (c) forming an image of the illuminated portion of said main pattern area and (d) illuminating connection ends of said segments in a wafer area with an illumination beam; and (e) forming an image of the illuminated portion of said stitching area and producing a halftone gray level dosage distribution in said wafer area corresponding to the common pattern, wherein said common patterns of adjacent segments substantially overlap in the stitching area.

12. The method of claim 11, wherein the stitching area is adjacent to the main pattern area, and the stitching area is the connection end of the segments.

13. The method of claim 11, wherein the stitching pattern in the stitching area comprises a coupling pattern.

14. The method of claim 11, wherein the stitching pattern in the stitching area has the halftone gray level dosage distribution.

15. A method of fabricating a mask comprising:

(a) dividing a mask generation date file into a plurality of segments, said segments including a main pattern area and a stitching area, each stitching area containing a respective geometric pattern that extends across an entire width of a pair of line segments that extend on both sides of the stitching area, the common pattern including a plurality of rectangles or squares; and (b) forming a set of geometric features in the stitching area, said geometric features producing a halftone gray level dosage distribution after illumination.

16. The method of claim 15, wherein the stitching area is adjacent to the main pattern area, and the stitching area is at a connection end of the segments.

17. The method of claim 15, wherein the geometric pattern in at least one of the stitching areas comprises a coupling pattern.

18. The method of claim 15, wherein the geometric pattern in the stitching area has the halftone gray level dosage distribution.

* * * * *